(12) United States Patent
Reykowski

(10) Patent No.: US 10,416,251 B2
(45) Date of Patent: Sep. 17, 2019

(54) WIRELESS CLOCK SYNCHRONIZATION SYSTEM FOR MAGNETIC RESONANCE IMAGING SYSTEMS AND METHOD OF OPERATION THEREOF

(71) Applicant: KONINKLIJKE PHILIPS N.V., Eindhoven (NL)

(72) Inventor: Arne Reykowski, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 171 days.

(21) Appl. No.: 15/129,872

(22) PCT Filed: Mar. 18, 2015

(86) PCT No.: PCT/IB2015/051971
§ 371 (c)(1),
(2) Date: Sep. 28, 2016

(87) PCT Pub. No.: WO2015/150953
PCT Pub. Date: Oct. 8, 2015

(65) Prior Publication Data
US 2017/0176552 A1   Jun. 22, 2017

Related U.S. Application Data

(60) Provisional application No. 61/972,988, filed on Mar. 31, 2014.

(51) Int. Cl.
*G01R 33/36* (2006.01)
*H04L 7/00* (2006.01)

(52) U.S. Cl.
CPC ........ *G01R 33/3692* (2013.01); *H04L 7/0091* (2013.01)

(58) Field of Classification Search
CPC .. G01R 33/36; G01R 33/3692; G01R 33/567; H04L 7/00; H04L 7/0091; H04L 7/0012; H04L 7/0054; H04L 7/0079; H04L 7/0087
See application file for complete search history.

(56) References Cited

U.S. PATENT DOCUMENTS

| 5,529,068 A | 6/1996 | Hoenninger et al. |
| 2007/0176601 A1 | 8/2007 | Adachi |

(Continued)

FOREIGN PATENT DOCUMENTS

| EP | 2570819 A1 | 3/2013 |
| WO | 2008155703 A1 | 12/2008 |
| WO | 2012027569 A1 | 3/2012 |

OTHER PUBLICATIONS

Hayes et al "An Efficient Highly Homogeneous Radiofrequency Coil for Whole Body NMR Imaging at 1.5T" Journal of Magnetic Resonance 63, p. 622-628 (1985).

(Continued)

*Primary Examiner* — Son T Le

(57) ABSTRACT

A synchronization system (100, 200, 400A, 400B, 600) for magnetic resonance (MR) systems includes a main magnet (104, 404, 692) having a main bore (113, 413) and opposed first and second ends (114); a system controller (110, 610) configured to generate a clock synchronization signal in accordance with a system clock; first and second transmission antennas (132,432, TX1, TX2) at opposite ends of the main magnet and configured to transmit the clock synchronization signal into the main bore of the main magnet; and a radio frequency (RF) portion (120, 660) including at least one reception antenna (136, RX1) and a synchronizer (122). The at least one reception antenna is situated within the main bore of the main magnet and is configured to receive the clock synchronization signal transmitted by the first and (Continued)

second transmission antennas. The synchronizer is coupled to the at least reception antenna and is configured to synchronize a clock of the RF portion in accordance with the received clock synchronization signal.

19 Claims, 8 Drawing Sheets

(56) References Cited

U.S. PATENT DOCUMENTS

| | | | |
|---|---|---|---|
| 2009/0267601 A1* | 10/2009 | Van Helvoort | G01R 33/3415 324/309 |
| 2011/0109316 A1 | 5/2011 | Akita et al. | |
| 2011/0273274 A1 | 11/2011 | Jung et al. | |
| 2012/0313645 A1* | 12/2012 | Biber | G01R 33/3692 324/322 |
| 2013/0069644 A1 | 3/2013 | Cho et al. | |
| 2013/0127465 A1 | 5/2013 | Kwon et al. | |
| 2013/0342198 A1 | 12/2013 | Vester | |
| 2016/0169991 A1* | 6/2016 | Kato | G01R 33/3692 324/322 |

OTHER PUBLICATIONS

O'Mahony et al "A 10-Ghz Global Clock Distribution Using Coupled Standing Wave Oscillators" IEEE Journal of Solid State Circuits, vol. 28, No. 11, Nov. 2003 p. 1813-1820.

Wei "Coil Array Optimization and Wireless Transceiver Design for MRI" Doctorial Thesis, University of Hong Kong 2007.

Sekiguchi et al "Development of Digital Wireless Transceiver for a MRI Coil With Clock Synchronization" Proc. Intl. Soc. Mag. Reson. Med. 17 (2009) p. 3048.

* cited by examiner

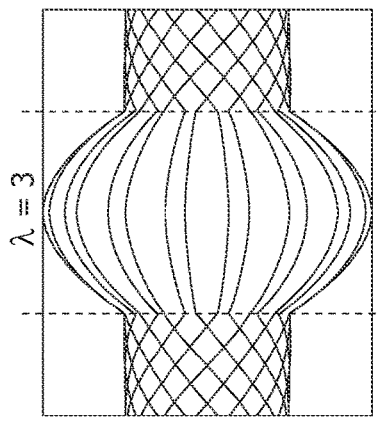
FIG. 8A
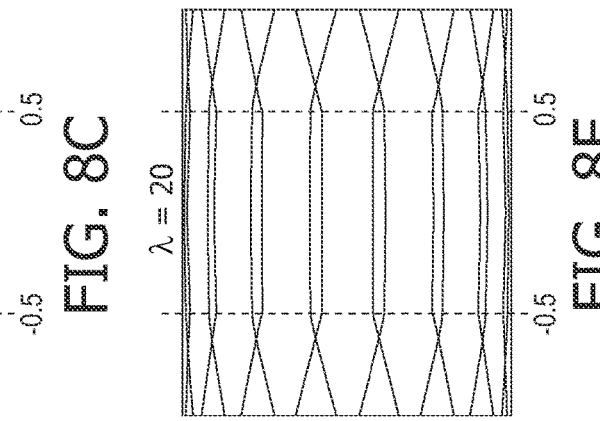
FIG. 8B
FIG. 8C
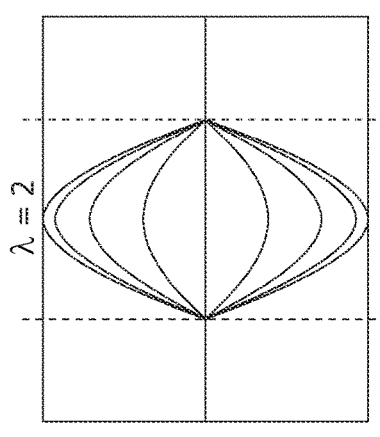
FIG. 8D
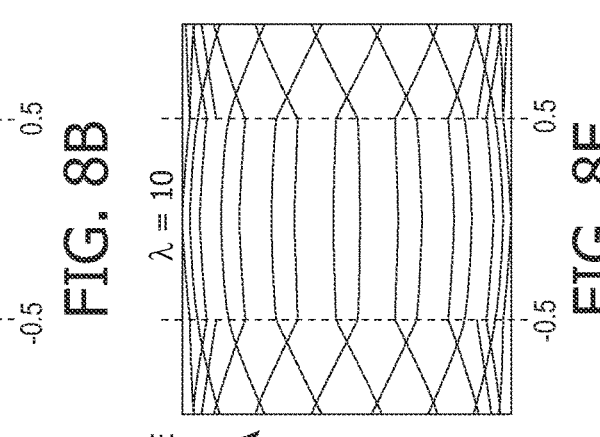
FIG. 8E
FIG. 8F

WIRELESS CLOCK SYNCHRONIZATION SYSTEM FOR MAGNETIC RESONANCE IMAGING SYSTEMS AND METHOD OF OPERATION THEREOF

CROSS REFERENCE TO RELATED APPLICATIONS

This application is a U.S. national phase application of International Application No. PCT/IB32015/051971, filed on Mar. 18, 2015, which claims the benefit of U.S. provisional Application Ser. No. 61/972,988 filed on Mar. 31, 2014 and is incorporated herein by reference.

The present system relates to a clock synchronization system for magnetic resonance (MR) imaging (MRI) and spectroscopy (MRS) systems and, more particularly, to a clock synchronization system for MRI and MRS systems employing wireless-type radio frequency (RF) coils and a method of operation thereof.

MRI is an imaging technique that uses frequency and phase encoding of protons for image reconstruction. Recently, wireless-type MRI radio-frequency (RF) coils (which may also be known as wireless-type or receive-only-type RF coils) have become available. These wireless-type RF coils may include a plurality of transducers (e.g., a transducer array) to acquire MR signals and thereafter sample and digitize the acquired MR signals to form a digitized signal which can include reconstructed image information. Accordingly, the wireless-type RF coils may include an image processing portion to digitize the acquired MR signals so as to form image information. This digitized signal is then transmitted to a system controller for further processing and/or output on a display of the system. An advantage of wireless-type RF coils is that they can transmit the digitized information wirelessly and therefore do not require galvanic cables such as RF cables which can introduce signal noise and cause undesirable heating and radiation emissions. However, wireless-type RF coils are difficult to properly synchronize to a system clock and, if synchronization is inaccurate, undesirable image degradation due to artifacts, etc. may occur. Accordingly, wireless-type RF coils typically use a wired or optical cable for accurate synchronization to a system clock.

With regard to a wireless clock synchronization system, small changes in the arrival time of a wireless synchronization signal will translate into phase noise inside a recovered clock signal of a wireless-type RF coil. These small changes in arrival time may be due to motion of the wireless receiver of the wireless-type RF coil, the patient and/or the patient table and can lead to image degradation.

The system(s), device(s), method(s), arrangements(s), user interface(s), computer program(s), processes, etc. (hereinafter each of which will be referred to as system, unless the context indicates otherwise), described herein address problems in prior art systems and/or provide further solutions.

In accordance with embodiments of the present system, there is disclosed a synchronization apparatus, which includes one or more of: a main magnet having a main bore and opposed first and second ends and configured to generate a substantially homogenous magnetic field within a scanning volume of the main bore; a system controller configured to generate a clock synchronization signal in accordance with a system clock; first and second transmission antennas, the first transmission antenna situated adjacent to the first end of the main magnet and the second transmission antenna situated adjacent to the second end of the main magnet, the first and second transmission antennas configured to transmit the clock synchronization signal into the main bore of the main magnet; and a radio frequency (RF) portion comprising at least one reception antenna and a synchronizer, the at least one reception antenna situated within the main bore of the main magnet and configured to receive the clock synchronization signal transmitted by the first and second transmission antennas, and the synchronizer coupled to the at least reception antenna and configured to synchronize a clock of the RF portion in accordance with the received clock synchronization signal.

It is also envisioned that the first and second transmission antennas may be configured to synchronously transmit the clock synchronization signal into the main bore from the respective opposed first and second ends of the main bore. Further, the first and second transmission antennas may further be configured relative to the main bore such that the transmitted clock synchronization signal forms a standing wave signal pattern within at least a portion of the main bore of the main magnet. For example, the first and second transmission antennas may be situated at corresponding opposed openings of the main magnet for inject the synchronization signal into the main bore of the main magnet. It is further envisioned that the at least one reception antenna may be situated between the first and second transmission antennas and within the standing wave signal pattern. Moreover, it is envisioned that the first and second antennas may be coupled to each other to form a standing wave resonator having a resonation volume in which the transmitted clock synchronization signal forms a standing wave signal pattern. It is also envisioned that the at least one reception antenna may be situated within the resonation volume so as to be situated within the standing wave signal pattern.

In accordance with embodiments of the present system, there is disclosed a method of wirelessly synchronizing a radio frequency (RF) portion of a magnetic resonance (MR) system to a system clock of the MR system, the MR system may include at least one controller and a main magnet having opposed first and second ends and a main bore situated between the opposed first and second ends, the method may be performed by the least one controller, and may include one or more acts of: generating a clock synchronization signal in accordance with the system clock; transmitting the clock synchronization signal into the main bore of the main magnet from a first transmission antenna situated adjacent to the first end of the main magnet and a second transmission antenna situated adjacent to the second end of the main magnet; receiving the clock synchronization signal that is transmitted from the first and second transmission antennas using at least one reception antenna situated within the main bore of the main magnet; and synchronizing (by a synchronization portion of the RF portion) an internal clock of the RF portion in accordance with the received clock synchronization signal.

It is further envisioned that the act of transmitting the clock synchronization signal may further include an act of synchronously transmitting the clock synchronization signal into the main bore from the opposed first and second ends of the main bore using the first and second transmission antennas, respectively. Moreover, the act of transmitting the clock synchronization signal may further include an act of forming a standing wave pattern within the main bore of the main magnet by the transmitted clock synchronization signal that is transmitted by the first and second transmission antennas. It is also envisioned that the act of receiving the clock synchronization signal may further include an act of receiving the standing wave pattern of the transmitted clock synchronization signal that is formed within the main bore of the main magnet. The method may further include an act of coupling the first and second antennas together to form a standing wave resonator to generate a standing wave signal pattern within the main bore of the main magnet when transmitting the clock synchronization signal. Moreover, the act of transmitting the clock synchronization signal may further include an act of the including a pilot tone within the synchronization signal, wherein the pilot tone is relatively free of phase noise within the main bore of the main magnet.

In accordance with yet further embodiments of the present system, there is disclosed a computer program stored on a computer readable memory medium (620), the computer program configured to wirelessly synchronize a radio frequency (RF) portion of a magnetic resonance (MR) system to a system clock of the MR system, the MR system including at least one controller and a main magnet having opposed first and second ends and a main bore situated between the opposed first and second ends, the computer program may included a program portion which may be configured to: generate a clock synchronization signal in accordance with the system clock; transmit the clock synchronization signal into the main bore of the main magnet using a first transmission antenna situated adjacent to the first end of the main magnet and a second transmission antenna situated adjacent to the second end of the main magnet; receive the clock synchronization signal from the first and second transmission antennas using at least one reception antenna situated within the main bore of the main magnet; and/or synchronize an internal clock of the RF portion in accordance with the received clock synchronization signal.

It is further envisioned that the program portion may be further configured to synchronously transmit the clock synchronization signal into the main bore from the opposed first and second ends of the main bore using the first and second transmission antennas, respectively, when transmitting the clock synchronization signal. Further, the computer program may also be configured to form a standing wave pattern within the main bore of the main magnet by the transmitted clock synchronization signal that is transmitted by the first and second transmission antennas. It is also envisioned that the computer program may be configured to include a pilot tone within the synchronization signal, wherein the pilot tone is relatively free of phase noise within the main bore of the main magnet. It is also envisioned that the computer program may also be configured to provide the clock synchronization signal to each of the first and second transmission antennas with equal amplitude and phase so as to form a standing wave pattern within the main bore when transmitting the clock synchronization signal. Moreover, it is envisioned that the computer program may be configured to couple the first and second antennas together to form a standing wave resonator to generate a standing wave signal pattern within the main bore of the main magnet when transmitting the clock synchronization signal.

The present invention is explained in further detail in the following exemplary embodiments and with reference to the figures, where identical or similar elements are partly indicated by the same or similar reference numerals, and the features of various exemplary embodiments being combinable. In the drawings:

FIG. 8A shows a graph of an output waveform as a function of wavelength for two transmitters transmitting a synchronization signal at a first wavelength in accordance with embodiments of the present system;

FIG. 8B shows a graph of an output waveform as a function of wavelength for two transmitters transmitting a synchronization signal at a second wavelength in accordance with embodiments of the present system;

FIG. 8C shows a graph of an output waveform as a function of wavelength for two transmitters transmitting a synchronization signal at a third wavelength in accordance with embodiments of the present system;

FIG. 8D shows a graph of an output waveform as a function of wavelength for two transmitters transmitting a synchronization signal at a fourth wavelength in accordance with embodiments of the present system;

FIG. 8E shows a graph of output waveform as a function of wavelength for two transmitters transmitting a synchronization signal at a fifth wavelength in accordance with embodiments of the present system; and FIG. 8F shows a graph of an output waveform as a function of wavelength for two transmitters transmitting a synchronization signal at a sixth wavelength in accordance with embodiments of the present system.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques, and methods are omitted so as not to obscure the description of the present system. It should be expressly understood that the drawings are included for illustrative purposes and do not represent the entire scope of the present system. In the accompanying drawings, like reference numbers in different drawings may designate similar elements. The term and/or and formatives thereof should be understood to mean that only one or more of the recited elements may need to be suitably present (e.g., only one recited element is present, two of the recited elements may be present, etc., up to all of the recited elements may be present) in a system in accordance with the claims recitation and in accordance with one or more embodiments of the present system.

Figure 1:
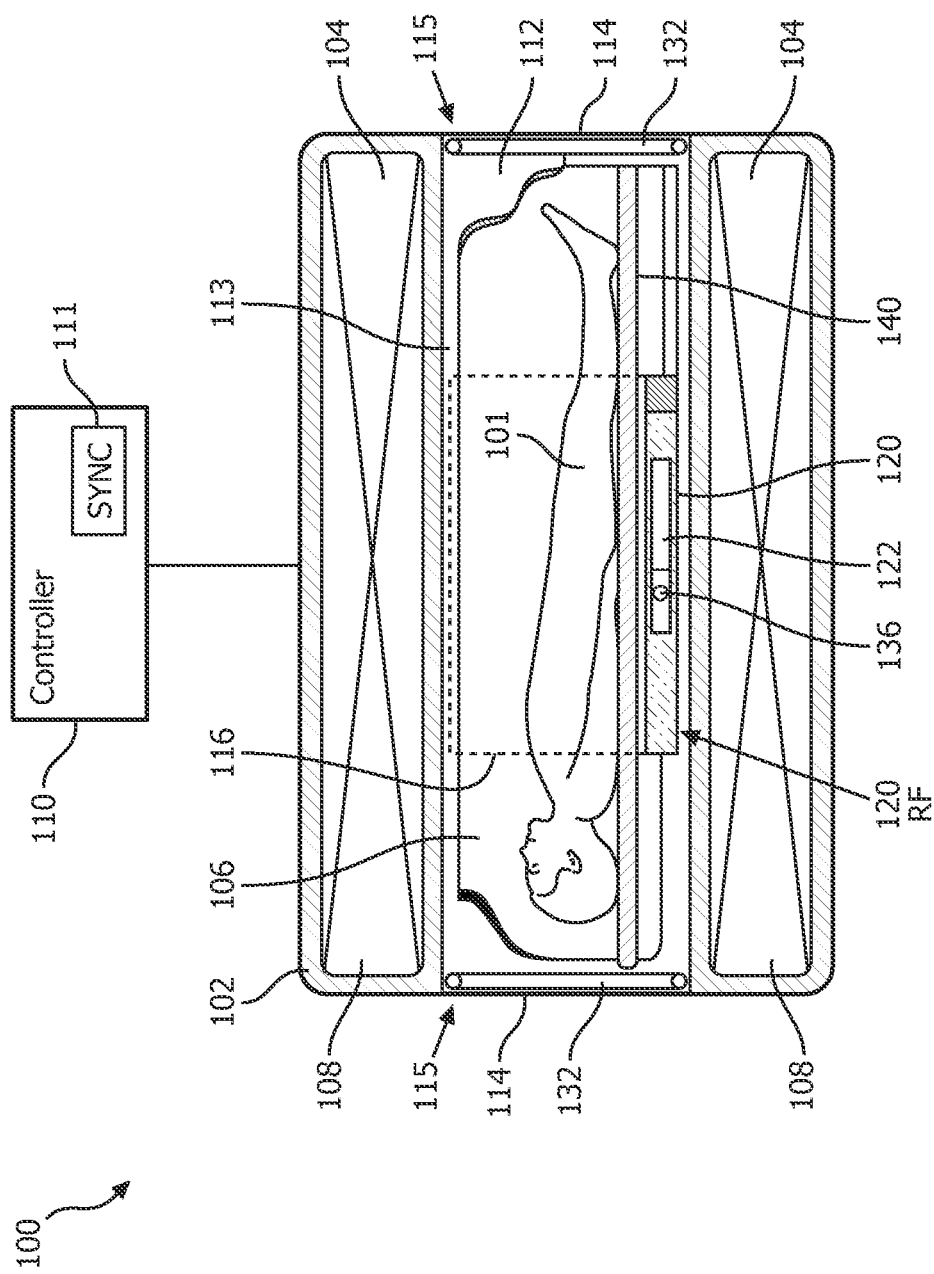
FIG. 1 shows a partially cutaway side view of a portion of an MR system in accordance with embodiments of the present system.

FIG. 1 shows a partially cutaway side view of a portion of an MR system 100 (hereinafter system 100 for the sake of clarity) in accordance with embodiments of the present system. The system 100 may include one or more of a controller 110, a memory, a display, a body 102, a main magnet 104, gradient coils 106, and an RF portion 120. A patient support 140 may be provided to support an object-of-interest (OOI) for scanning such as a patient 101 (e.g., a human patient, etc.) and/or to position the OOI such as the patient 101 in a desired position and/or orientation in relation to the body 102. In accordance with embodiments of the present system, positioning may be partially or completely controlled by the controller 110.

The body 102 may include at least one cavity 108 and a main bore 112 situated between opposed ends 114. The main bore 112 may be situated between opposed openings 115 of the body 102 and may be configured to receive the OOI such as the patient 101 through an opening 115 of the openings 115. The at least one cavity 108 may be configured to receive one or more of the main magnet 104, the gradient coils 106, and at least a portion of the RF portion 120. The body 102 may further include a cooling mechanism (e.g., a cryogenic cooling system, etc.) configured to cool portions of the system 100 such as the main magnet 104, if desired.

The controller 110 may control the overall operation of the system 100 and may include one or more logic devices such as processors (e.g., micro-processors, etc.) etc. The controller 110 may include one or more of a main magnet controller, a gradient controller, an RF controller, a system clock synchronizer 111 (hereinafter synchronizer for the sake of clarity), and a reconstructor. In accordance with embodiments of the present system, the main magnet controller may control the operation of the main magnet 104. The gradient controller may control the operation of the gradient coils 106. The RF controller may control the operation of the RF portion 120. The system clock synchronizer 111 may be operative to synchronize one or more clocks of the system such as a system clock and a clock of the RF portion 120 (e.g., an internal clock of the RF portion 120). The reconstructor may obtain digitized information (e.g., image information, spectrographic information, etc.) from the RF portion for further processing.

The controller 110 may further determine or otherwise obtain scan sequences, scan parameters, etc. from a user and/or from the memory and apply them during a scanning procedure. For example, the controller 110 may obtain a scan sequence from the memory and control, for example, the main magnet 104, the gradient coils 106 and/or RF portion 120 accordingly. The controller 110 may include at least one controller such as system controller and may be formed integrally with, or separately from, the body 102. For example, in some embodiments, the controller 110 may be remotely located from the body 102 and may communicate with one or more of the memory, the display, the main magnet 104, the gradient coils 106, the RF portion 120, and the reconstructor via any suitable method such as via wired, and/or wireless communication methods. Further, the controller 110 may communicate with one or more of the above elements via one or more networks (e.g., a wide area network (WAN), a local area network (LAN), the Internet, a proprietary communication bus, a controller area network (CAN), a telephony network, etc.).

The main magnet 104 may have a bore 113 and may be configured to generate a main magnetic field (e.g., a $B_0$ field) within the main bore 112. The main magnetic field may be substantially homogenous within a scanning volume 116 of the main bore 112. The main magnet 104 may include one or more main magnets each configured to generate at least a portion of a main magnetic field. The main magnet 104 may be an annular (e.g., ring) magnet. However, in yet other embodiments, the main magnet may include any suitable magnet or magnets such as an annular or ring magnet, a planar magnet, a split magnet, an open magnet, a semicircular magnet (e.g., a C-shaped magnet, etc.). The main magnet 104 or portions thereof may be formed from any suitable material such as a superconducting material and/or may operate under the control of the controller 110.

The gradient coils 106 may include one or more gradient coils (e.g., x-, y-, and z-gradient coils) which may produce one or more gradient fields along one or more corresponding axes under the control of the controller 110. The synchronizer 111 may be operative to generate and output a synchronization signal (e.g., a system clock synchronization signal) for transmission by at least one transmission antenna such as transmission antennas 132 (e.g., synchronization transmission antennas) located at or near adjacent opposed ends 114 of the body 102 so that the synchronization signal propagates into the main bore 112 from opposite directions. The synchronization signal may be formed or otherwise generated by the synchronizer 111 operating in accordance with embodiments of the present system and may correspond with a system clock. More particularly, in accordance with some embodiments, the synchronization signal may be represented as $V_p(t) \cdot \sin(\omega_c \cdot t)$ where $V_p$ is an amplitude of the pilot signal as a function of time (t), and $\omega_c$ is an angular frequency of the carrier signal. The synchronization signal may include a pilot signal (including the pilot tone) $V_p(t)$ that is modulated onto a carrier signal and transmitted via a wireless channel to the RF portion 120. Thus, the pilot signal may be mixed with a carrier signal and transmitted by the transmission antennas 132. The carrier signal may include information such as the pilot tone. The synchronization signal may propagate within the main bore 112 from opposed ends 114 of the body 102 and may be received by the at least one receive antenna 136 as will be discussed further herein. It is further envisioned that in some embodiments the transmission antenna(s) 132 may be located at the opposed ends 114 of the body 102 and may be at least partially outside of the main bore 112 of the body 102. In yet other embodiments, it is envisioned that the transmission antennas 132 may be located within the main bore 112 of the body 102 and at a distance from the opposed ends 114 of the body.

The RF coil portion 120 may include a plurality of RF transmission coils configured to transmit RF excitation pulses and/or receive (e.g., induced) MR signals (e.g., echo information) under the control of the controller 110. For example, in some embodiments, the RF portion 120 may include a transducer array of transmission and/or reception coils. The RF portion 120 may be situated within the main bore 112 of the body 102 and may be placed in a desired position and/or orientation such as under the patient support to obtain images of a desired scanning volume within the main bore 112. The RF portion 120 may operate under the control of the controller 110. The RF portion 120 may further include a synchronizer 122 which may include one or more of at least one receive antenna 136 (e.g., a synchronization signal reception antenna), a signal amplifier, a signal filter, and a Phase-Locked-Loop (PLL) circuit, one or more of which may communicate with each other. The at least one receive antenna 136 may be configured to receive the synchronization signal and provide the received synchronization signal to the amplifier. In accordance with embodiments of the present system, the amplifier may amplify the received synchronization signal (e.g., amplify a pilot tone), and provide the amplified synchronization signal to the signal filter for filtering. The at least one receive antenna 136 may be located in a desired location and may be remotely located relative to the synchronizer 122, if desired. The signal filter may then provide the filtered signal to one or more PLL circuits which may lock onto, for example the recovered pilot tone so as to adjust a phase of an RF clock signal. Accordingly, the pilot tone may be recovered from the received synchronization signal and used to adjust the phase of the RF clock signal. Accordingly, the received synchronization signal may be used to synchronize a clock of the RF coil portion 120 to the system clock.

The RF portion 120 may have two or more operative states such as a tune state and a detune state. In the tune state, a detune switch portion may be operative to tune the one or more receive loops so that they can acquire MR signals (hereinafter echo information for the sake of clarity). Thereafter, regardless of (tune or detune) state, the receive-only RF portion 120 may locally sample the echo information and digitize the sampled echo information so as to form corresponding digital data (e.g., k-space data). The digital data may then be reconstructed to form reconstructed MR information including one or more of image information, spectrographic information, location information (e.g., for MR guided interventional procedures), etc. The digital data and/or the reconstructed MR information may then be wirelessly transmitted from the RF portion 120 using any suitable wireless communication method to the controller 110 for further processing. By using wireless communication methods to transmit the digitized data, the use of galvanic conductors such as RF cables may be avoided.

Figure 2:
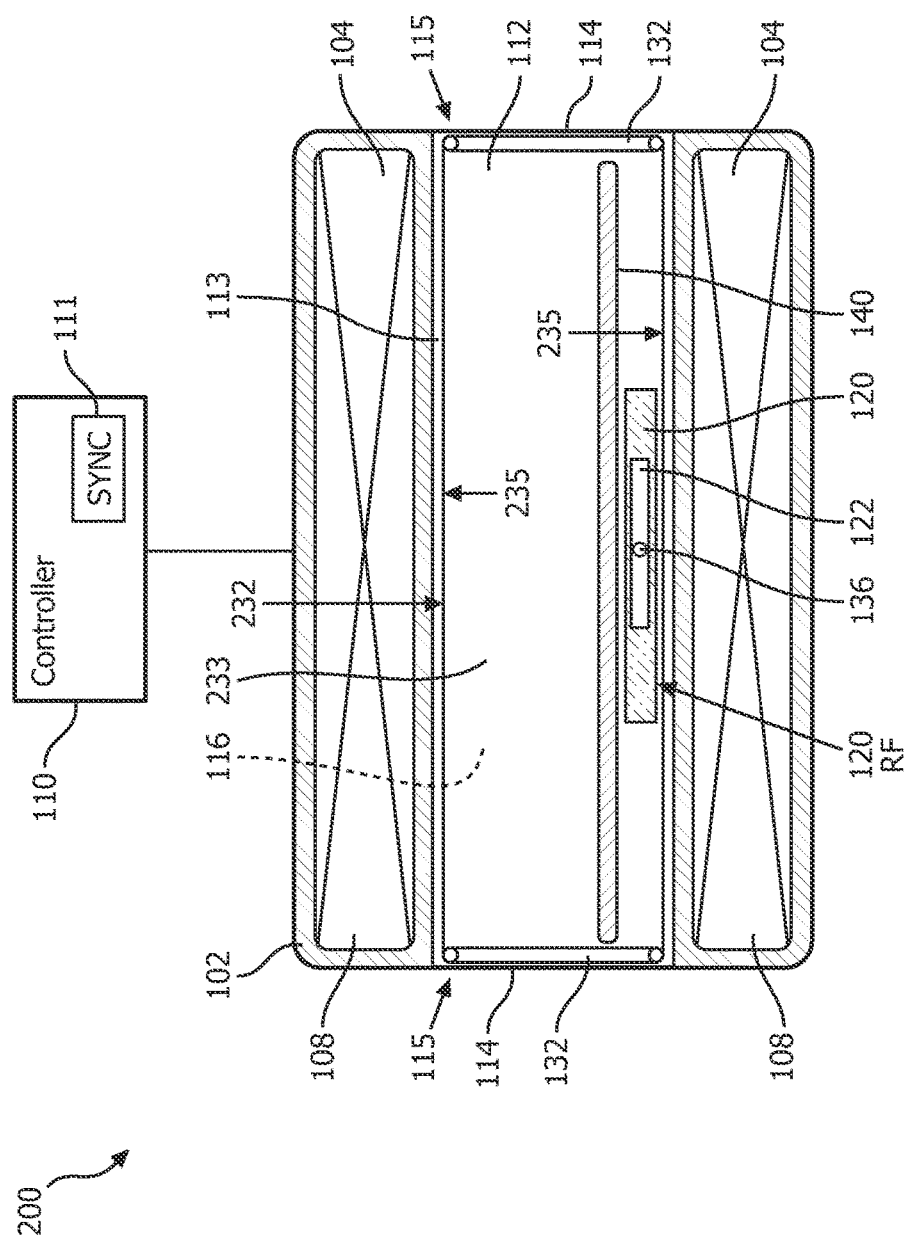
FIG. 2 shows a partially cutaway cross sectional view of a portion of an MR system in accordance with embodiments of the present system.

FIG. 2 shows a partially cutaway cross sectional view of a portion of an MR system 200 in accordance with embodiments of the present system. The MR system 200 is similar to the MR system 100 and similar numerical designations are used. However, rather than using (centrally uncoupled) synchronization transmission antennas 132 for transmitting the synchronization signal, the synchronization transmission antennas are coupled to each other using at least one conductive lead 235 (e.g., a center lead) so as to form a single (standing wave) resonator 232 defining a resonation volume 233. When transmitting the synchronization signal, the single resonator 232 transmits the synchronization signal such that it forms a standing-wave-type transmission signal with low phase variation (as will be described below with reference to Equation 5 below) within a resonation volume 233 of the single resonator 232. Then, the at least one synchronization reception antenna 136 may receive the synchronization signal and provide the received synchronization signal to the synchronizer 122 for further processing to synchronize a clock of the RF portion 120 to the system clock.

In some embodiments, at least one switch (e.g., an on or off electrical switch such as a transistor-type switch) controlled by a controller of the system may be serially coupled to each of the at least one lead 235 so as to actively and/or selectively (e.g., under the control of the controller) couple or decouple the synchronization transmission antennas 132 to each other, as may be desired.

In yet other embodiments, it is envisioned that a plurality of transmission and/or reception antennas may be provided to transmit and/or receive the synchronization signal. A controller may be provided to match and/or select antenna sets to use in accordance with system and/or user settings. For example, the controller may match synchronization transmission antennas to a type and/or location of an RF coil used during an MR scanning procedure. Thus, the system may include switches to control couple and/or decouple transmission and/or reception antennas which may be used to transmit and/or receive, respectively, synchronization signal in accordance with embodiments of the present system.

Because of the transmission methods used to transmit the synchronization signal within the main bore, the received synchronization signal and information recovered therefrom such as a pilot tone is relatively free of phase noise. Accordingly, images reconstructed by the RF portion may be free of the effects of noise due to phase noise of the recovered synchronization signal. Thus, the signal resonator 232 may form a single standing wave resonator having a resonation volume in which the synchronization signal transmitted therefrom forms a standing wave pattern. The single resonator 232 may be formed using first and second transmission antennas (e.g., 132) which are coupled to each other to form a single resonator such as the single resonator 232. Then, the at least one synchronization reception antenna 136 may be placed within the resonation volume and receive the synchronization signal. Thus, the at least one synchronization reception antenna 136 may be considered to be situated within the single resonator 232.

Figure 3:
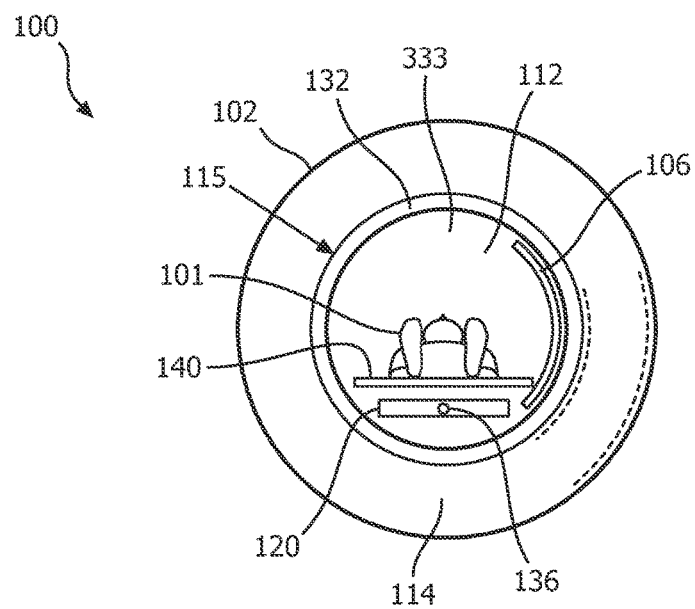
FIG. 3 shows an end view of a portion of the MR system in accordance with embodiments of the present system.

FIG. 3 shows an end view of a portion of the MR system 100 in accordance with embodiments of the present system. Each of the synchronization transmission antennas 132 is situated within the main bore 112 at, or adjacent to, a corresponding end 114 of the body 102. Further, each of the synchronization transmission antennas 132 may form a loop defining a center opening 333 through which the patient 101 may pass through during insertion and/or removal from the main bore 112 of the body 102. An end view of the MR system 200 is similar. However, the synchronization transmission antennas 132 are coupled to each other so as to form a single resonator.

Figures 4A, 4B:
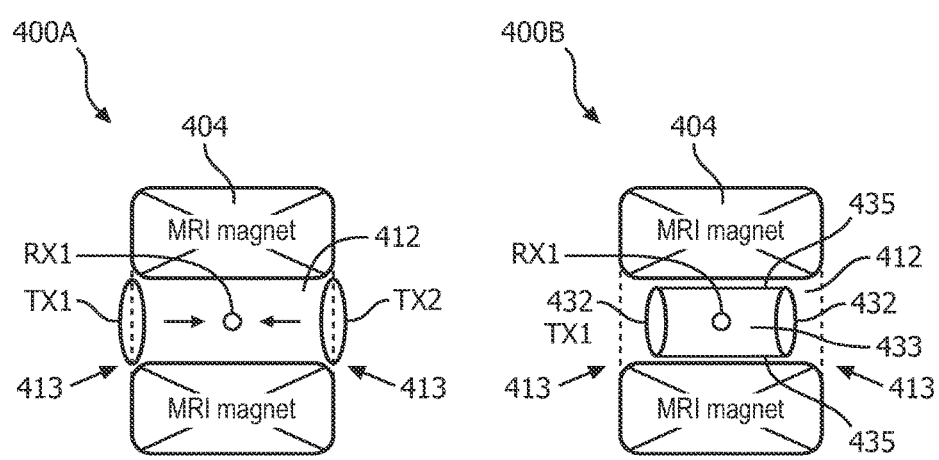
FIG. 4A shows a schematic block diagram of portion of a wireless clock synchronization system in accordance with embodiments of the present system.
FIG. 4B shows a schematic block diagram of portion of a wireless clock synchronization system in accordance with embodiments of the present system.

FIG. 4A shows a schematic block diagram of portion of a wireless clock synchronization system 400A in accordance with embodiments of the present system. The wireless clock synchronization system 400A may be similar to the system 100 of FIG. 1 and may include a main magnet (MRI Magnet) 404 which has opposed openings 413 and a main bore 412 situated between the opposed openings 413. First and second synchronization signal transmitters TX1 and TX2, respectively, are situated at or near an adjacent opening 413. A synchronization reception antenna RX1 is situated within the main bore 412 and between the synchronization signal transmitters TX1 and TX2. The first and second synchronization signal transmitters TX1 and TX2 may propagate a wireless synchronization signal into the MRI bore from opposing ends of the bore 412 as may be discussed with regard to FIGS. 8A through 8F below.

For example, FIGS. 8A through 8F show corresponding graphs 800A through 800F of output waveforms as a function of wavelength for two transmitters transmitting a synchronization signal at different wavelengths in accordance with embodiments of the present system. In each of FIGS. 8A through 8F, the output waveforms (e.g., wave patterns) are shown as a function of transmission wavelength $\lambda$ for two transmitters having equal phase excitation and being spaced at unit distances of +/−0.5 as illustrated by the dotted lines. Comparing the output waveforms of graphs 800A through 800F, it is seen that the longer wavelengths lead to better phase homogeneity. Similar values may be attained for other synchronization signal transmitter(s) operating in accordance with embodiments of the present system. Further, although integer values of $\lambda$ are shown to illustrate a comparison between relative values, other values of $\lambda$ are also envisioned.

FIG. 4B shows a schematic block diagram of portion of a wireless clock synchronization system 400B in accordance with embodiments of the present system. The wireless clock synchronization system 400B may be similar to the system 200 of FIG. 2 and may include a main magnet (MRI Magnet) 404 which has opposed openings 413 and a main bore 412 situated between the opposed openings 413. A synchronization signal transmitter TX1 may include a single resonator which generates a standing wave with low phase variation over a resonation volume 433 (e.g., a central volume) of the signal transmitter in which a synchronization signal receiver such as RX 1 is located. More particularly, the synchronization signal transmitter TX1 may include first and second transmission antenna coils 432 which are coupled to each other using at least one conductive lead 435 (e.g., a center lead some of which is shown partially cutaway for the sake of clarity) situated within the main bore 412 to form a single (standing wave) resonator TX1 having a resonation volume 433 in which the transmitted synchronization signal forms a standing waveform signal pattern. Thus, the single resonator TX1 may form a birdcage-type resonator which may generate a standing wave pattern with very low phase variation across a large volume. At least one synchronization reception antenna RX1 may be placed within the resonation volume (and, thus, within the standing wave signal pattern) and receive the transmitted synchronization signal (which forms the standing wave signal pattern).

Figure 4E:
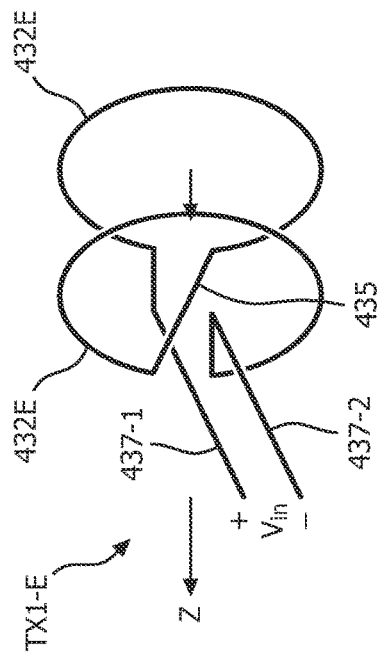
FIG. 4E shows a front perspective view of another synchronization signal transmitter in accordance with embodiments of the present system.
Figure 4F:
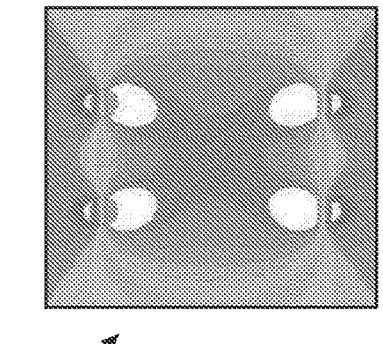
FIG. 4F shows a graph of a radiation pattern of the single resonator of FIG. 4E in accordance with embodiments of the present system.
Figure 4C:
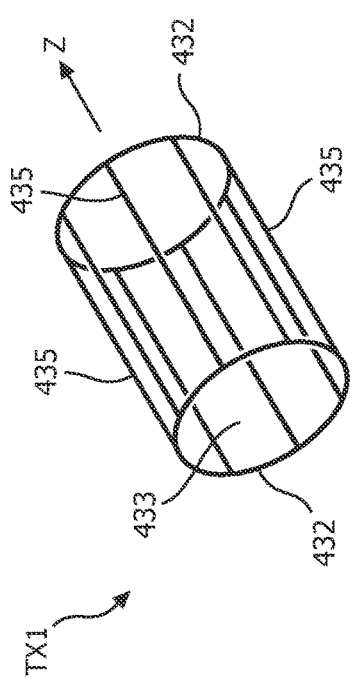
FIG. 4C shows a perspective view of the single resonator of FIG. 4B in accordance with embodiments of the present system.

FIG. 4C shows a perspective view of the single resonator TX1 of FIG. 4B in accordance with embodiments of the present system. Each of the at least one center leads 435 may be radially spaced apart from each other by, for example, an equal distance, if desired.

Figure 4D:
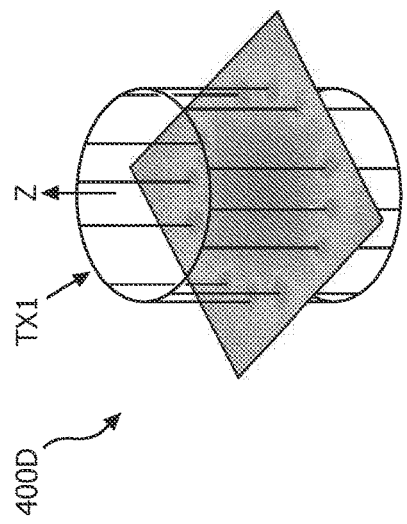
FIG. 4D shows a graph of a radiation pattern of the single resonator of FIG. 4B in accordance with embodiments of the present system.

FIG. 4D shows a graph 400D of a radiation pattern of the single resonator TX1 of FIG. 4B in accordance with embodiments of the present system. The graph 400D is superimposed upon an illustration of the single resonator TX1 to illustrate orientation.

FIG. 4E shows a front perspective view of another synchronization signal transmitter TX1-E in accordance with embodiments of the present system. The synchronization signal transmitter TX1-E may include a single resonator which generates a standing wave with low phase variation over a resonation volume. The synchronization signal transmitter TX1-E may include first and second transmission antenna coils 432E which are coupled to each other using at least one conductive lead 435 (e.g., a center lead some of which is shown partially cutaway for the sake of clarity). An input signal Vin may be provided to the spaced apart antenna coils 432E via input leads 437-1 and 437-2 which are each coupled to an antenna coil 432E. The synchronization signal transmitter TX1-E may form another birdcage-type resonator which may generate a standing wave pattern with very low phase variation across a large volume. At least one synchronization reception antenna may be placed within the resonation volume (and, thus, within the standing wave signal pattern) and receive the transmitted synchronization signal (e.g., which forms the standing wave signal pattern).

FIG. 4F shows a graph 400F of a radiation pattern of the single resonator TX1-E of FIG. 4E in accordance with embodiments of the present system.

Figure 7A:
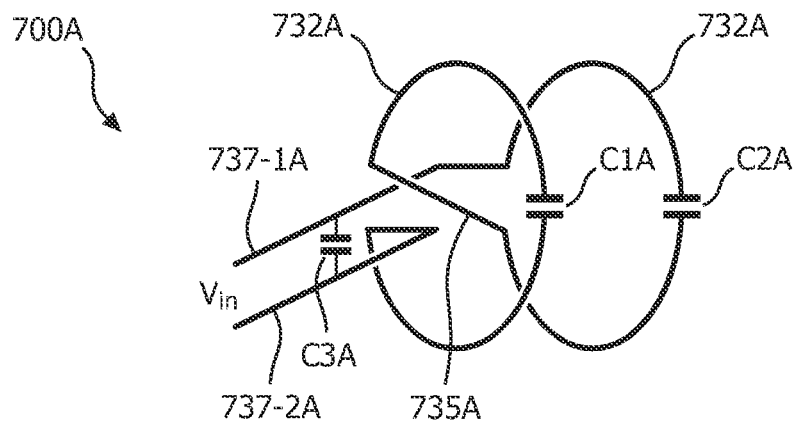
FIG. 7A shows a front perspective view of a Helmholtz-type synchronization signal transmitter in accordance with embodiments of the present system.
Figure 7B:
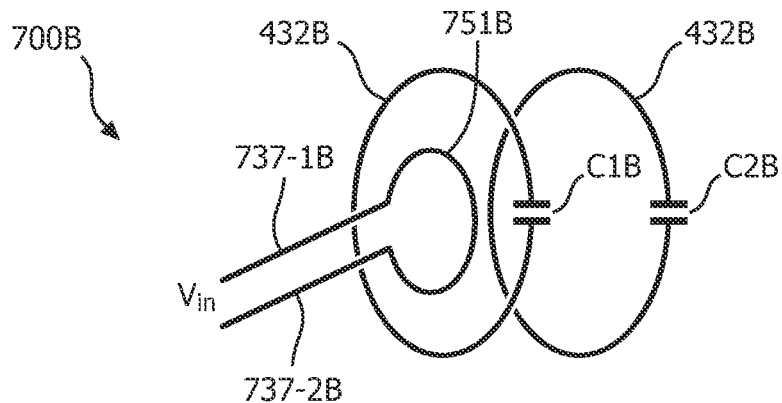
FIG. 7B shows a front perspective view of a passively driven Helmholtz-type synchronization signal transmitter in accordance with embodiments of the present system.
Figure 7C:
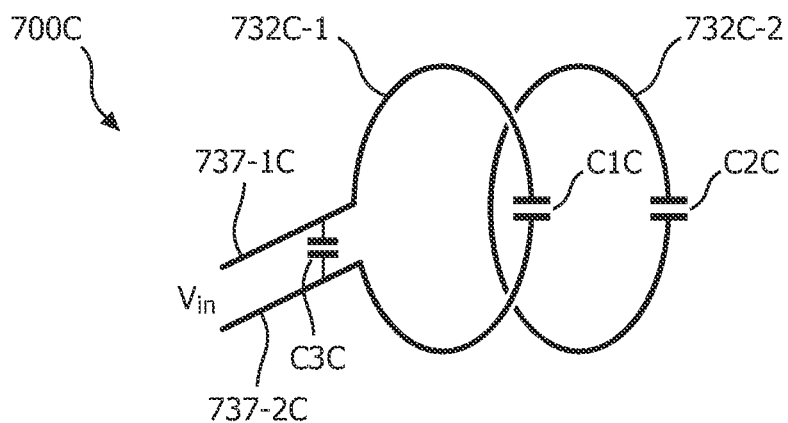
FIG. 7C shows a front perspective view of a Helmholtz-type synchronization signal transmitter in accordance with embodiments of the present system.

Various Helmholtz-type resonator-type synchronization signal transmitters (TXs) are shown with reference to FIGS. 7A through 7C. More particularly, FIG. 7A shows a front perspective view of a Helmholtz-type synchronization signal transmitter 700A in accordance with embodiments of the present system. The synchronization signal transmitter 700A may be similar to the synchronization signal transmitter TX1-E of FIG. 4E and may include first and second transmission antenna coils 732 which are coupled to each other using at least one conductive lead 735A and input leads 737-1A and 737-2A which are each coupled to a respective one of the antenna coils 732A and configured to receive an input signal Vin. The transmission antenna coils 732 may include a respective capacitor C1A and C2A which may provide capacitance to the respective coil. Further, an input capacitor C3A may be coupled across the input leads 737-1A and 737-2A to capacitively couple the input leads 737-1A and 737-2A to each other.

FIG. 7B shows a front perspective view of a passively driven Helmholtz-type synchronization signal transmitter 700B in accordance with embodiments of the present system. The synchronization signal transmitter 700B may include first and second transmission antenna coils 732B each of which may form an annular ring with a respective capacitor C1B, C2B coupled thereto. A driving antenna 751B may be coupled to input leads 737-1B and 737-2B which may receive a drive signal. The driving antenna 751B may couple to the first and second transmission antenna coils 732B so as to passively (wirelessly) drive the first and second transmission antenna coils 732B in accordance with embodiments of the present system.

FIG. 7C shows a front perspective view of a Helmholtz-type synchronization signal transmitter 700C in accordance with embodiments of the present system. The signal transmitter 700C is generally similar to the signal transmitter 700B and may include first and second transmission antenna coils 732-1C and 732-2C, respectively. The first transmission antenna coil 732-1C may include a capacitor C1C and may be coupled to input leads 737-1C and 737-2C which are configured to receive an input signal Vin for actively driving the first transmission antenna coil 732-1C. The second transmission antenna coil 732-2C may form an annular ring with a capacitor C2B coupled thereto and may be wirelessly coupled to the first transmission antenna coil 732-1C so as to be passively driven by the first transmission antenna coil 732-1C.

Thus, embodiments of the present system may provide a wireless-type clock synchronization system and method to synchronize a wireless-type RF coil to a system clock which for example can compensate for small changes in an arrival time of a wireless clock synchronization signal, such as those due to motion of the wireless receiver of the wireless-type RF coil, the patient support and/or the patient. In this way, the present system may reduce or entirely prevent phase noise within a recovered clock synchronization signal that for example may be used for synchronization of a clock signal of the RF portion with the system clock. These changes in arrival time may, for example, be due to motion of the wireless receiver, the patient and/or the patient support during use. Further, these motions may be exacerbated by vibration and/or forces generated by MRS and MRI systems. In accordance with embodiments of the present system, the wireless-type clock synchronization system may employ a plurality of transmitters and/or receivers to respectively transmit and receive the wireless clock synchronization signal using a plurality of transmission/reception methods. These methods may be performed in accordance with embodiments of the present system. Further, in accordance with embodiments of the present system, the recovered clock synchronization signal may minimize or otherwise reduce root-mean-squared (RMS) phase error of a digitized reconstructed MR signal so as to reduce image artifacts and enhance image clarity. For example, in accordance with embodiments of the present system, if it is desired that clock-induced root-mean-squared (RMS) phase error in image raw data remain below 1 degree, then the RMS time jitter should remain below 44 picoseconds (ps) at 64 MHz and below 22 ps at 128 MHz.

In yet other embodiments, it is envisioned that the synchronization signal transmission antennas (e.g., 132) may include more than two transmission antennas. In yet other embodiments, it is envisioned that a single synchronization signal transmitter may be provided to transmit the synchronization signal and/or a plurality of reception antennas may be placed within the bore of the magnet to receive the transmitted synchronization signal.

Figure 5:
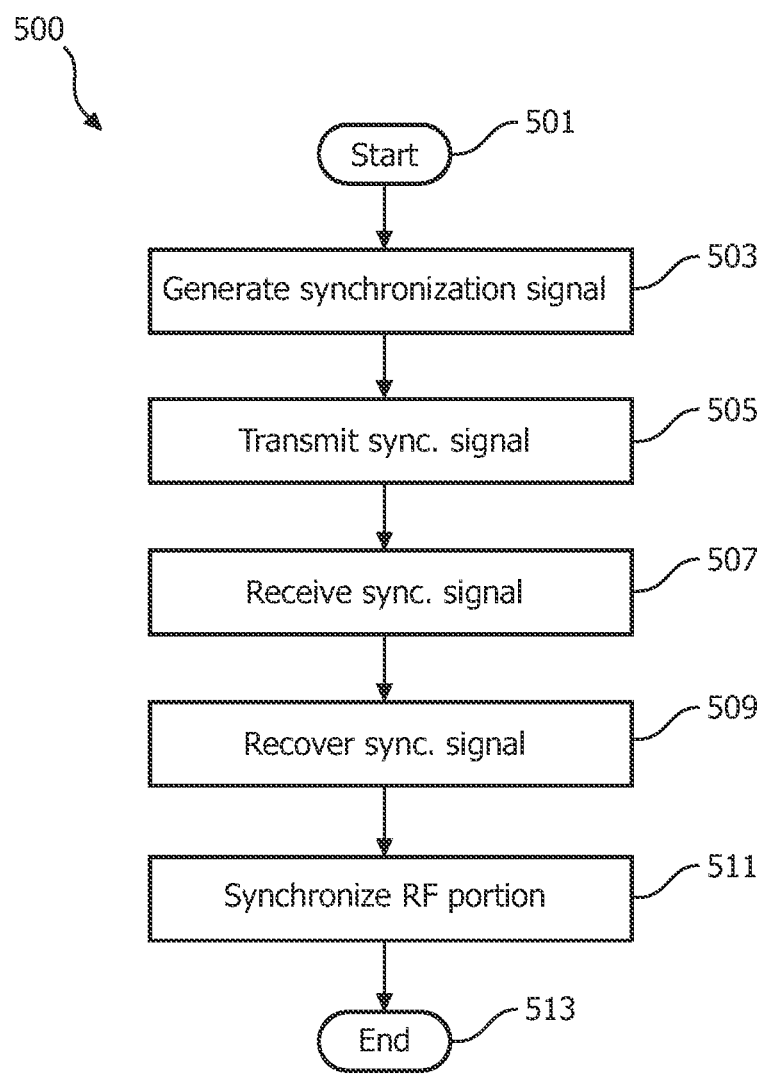
FIG. 5 shows a functional flow diagram that illustrates a wireless clock synchronization process performed in accordance with embodiments of the present system.

FIG. 5 shows a functional flow diagram that illustrates a wireless clock synchronization process 500 performed in accordance with embodiments of the present system. The process 500 may be performed using one or more computers communicating over a network and may obtain information from, and/or store information to one or more memories which may be local and/or remote from each other. The process 500 may include one of more of the following acts. In some embodiments, the acts of process 500 may be performed using a MR system such as an MRI or MRS system operating in accordance with embodiments of the present system. Further, one or more of these acts may be combined and/or separated into sub-acts, if desired. Further, one or more of these acts may be skipped depending upon settings. In operation, the process may start during act 501 and then proceed to act 503.

During act 503, the process may generate a synchronization signal in accordance with a system clock of the MR system. Thus, the synchronization signal may be a system clock synchronization signal. After completing act 503, the process may continue to act 505

During act 505, the process may transmit the synchronization signal using at least one antenna such as a resonator (e.g., TX1 of FIG. 4B, 232 of FIG. 2) and/or transmission antennas (TX1 and TX2 of FIG. 4A and 132 of FIG. 1) into a main bore the MR system. The transmitted synchronization signal may be transmitted using methods of the present system to form a standing wave pattern in at least a portion of the main bore of the MR system as is discussed herein. The synchronization signal may include a carrier signal with a pilot tone. Accordingly, the antenna transmitting the synchronization signal may do so by transmitting the carrier signal with the pilot tone. After completing act 505, the process may continue to act 507.

During act 507, the process may receive the transmitted synchronization signal using at least one synchronization signal reception antenna such as a reception antenna (e.g., 136, RX1) situated within the main bore and/or within the standing wave pattern. The received synchronization signal may then be provided to a synchronizer of the RF coil portion for further processing. After completing act 507, the process may continue to act 509.

During act 509, the process may recover the synchronization signal or portions thereof from the received synchronization signal. For example, the process may recover a pilot tone from a carrier signal of the received synchronization signal. For example, the carrier signal of the received synchronization signal may be processed in accordance with embodiments of the present system to retrieve a pilot tone included within the carrier signal. Then, the pilot tone (pilot signal) of the carrier signal may be amplified, filtered. After completing act 509, the process may continue to act 511.

During act 511 the process may synchronize a clock of the RF portion to the system clock in accordance with the recovered synchronization signal. For example, the recovered pilot tone may be used to synchronize a PLL circuit of a synchronization circuit of an RF coil of the system so as to synchronize the clock of the RF portion to the system clock.

With regard to the received synchronization signal, this signal may be considered a recovered signal r and may be represented with respect to time t as r(t). Then phase noise $\Phi r(t)$ of the recovered signal r(t) is a combination of phase noise $\Phi p(t)$ of the received pilot signal p which includes a pilot tone and the phase noise generated by the PLL. It is therefore of interest to minimize the phase noise $\Phi p(t)$ of the received pilot signal.

Assuming that in a wireless clock synchronization system of an MR system, a single transmission antenna is provided to transmit a propagating-type synchronization signal (as opposed to the present system of a standing wave-type synchronization signal emitted by two spaced apart antennas or a resonator-type antenna defining a resonation volume) within a main bore of the MR system. This synchronization signal is transmitted a distance L (measured between the transmission antenna (e.g., Tx) and the reception antenna via a propagating wave with a propagation constant k. Thereafter, this synchronization signal is received by the reception antenna and may be expressed as a function of time as shown in Equation 1 below.

$$V_p(t) \cdot [\sin(\omega_c \cdot t \cdot k \cdot (L+\Delta L)) + n(t)], \qquad \text{Eq. (1)}$$

where $V_p(t)$ is peak amplitude of the pilot tone as a function of time t, $\omega_c$ is angular frequency of the carrier signal, n(t) represents additive channel noise, $\Delta L$ is a variation of electrical distance (e.g., between transmission and reception antennas). The effect of the noise n(t) added by the channel can be reduced by increasing the signal level, however this will have no effect on the variations in the arrival time $\Delta t$.

In such a configuration, the relationship between phase error $\Delta \Phi$, time-of-arrival $\Delta t$ and the variation of electrical distance $\Delta L$ may be represented as shown in Equation 2 below.

$$\Delta \Phi = \omega_c \cdot \Delta t = k \cdot \Delta L. \qquad \text{Eq. (2)}$$

Therefore, changes in the electrical distance $\Delta L$ (e.g., due to variations in distance between transmission and reception antennas which result in corresponding variations in the electrical distance $\Delta L$) cause a variation $\Delta t$ in time-of-arrival which is experienced as phase noise $\Delta \Phi$ in the received synchronization signal.

However, if it is assumed that the reception antenna (e.g., a receive coil and/or transducer) is placed an equal distance between two transmitters (e.g., transmission antennas) each of which transmits the synchronization signal with equal amplitude and phase, the received synchronization signal may be represented as a function of time as shown in Equation 3 below.

$$\frac{V_p(t)}{2} \cdot [\sin(\omega_c \cdot t - k \cdot (L + \Delta L)) + \sin(\omega_c \cdot t - k \cdot (L - \Delta L))] + n(t), \quad \text{Eq. (3)}$$

then, substituting the trigonometric identity shown in Equation 4 below into Equation 3, the received synchronization signal may be represented as a function of time as shown in Equation 5 below.

$$\sin\theta\cos\varphi = \frac{\sin(\theta + \varphi) + \sin(\theta - \varphi)}{2}, \quad \text{Eq. (4)}$$

$$V_p(t) \cdot \left[\sin(\omega_c \cdot t - k \cdot L) \cdot \underbrace{\cos(k \cdot \Delta L)}_{\approx 1}\right] + n(t) = \quad \text{Eq. (5)}$$

$$V_p(t) \cdot \sin(\omega_c \cdot t - k \cdot L) + n(t).$$

With reference to Equation 5, it is seen that a small change in location will not generate any phase noise. The reason for this result is that rather than using the propagating synchronization signal as set forth by Equation 1, a standing-wave synchronization signal having a standing wave pattern that has low phase variation is used to transmit the synchronization signal.

Accordingly, embodiments of the present system may include a clock synchronization circuit operative to reduce phase errors in recovered (e.g., received) wireless synchronization signals by employing a plurality of transmitters and/or receivers to respectively transmit and/or receive clock synchronization signals with low phase variation. Accordingly, wireless clock synchronization with reduced phase noise may be achieved through the use of a plurality of transmission and/or reception methods operative in accordance with embodiments of the present system so as to transmit a synchronization signal with low phase variation in a desired volume such as in a resonation volume of a single resonator or synchronization transmission antennas.

Figure 6:
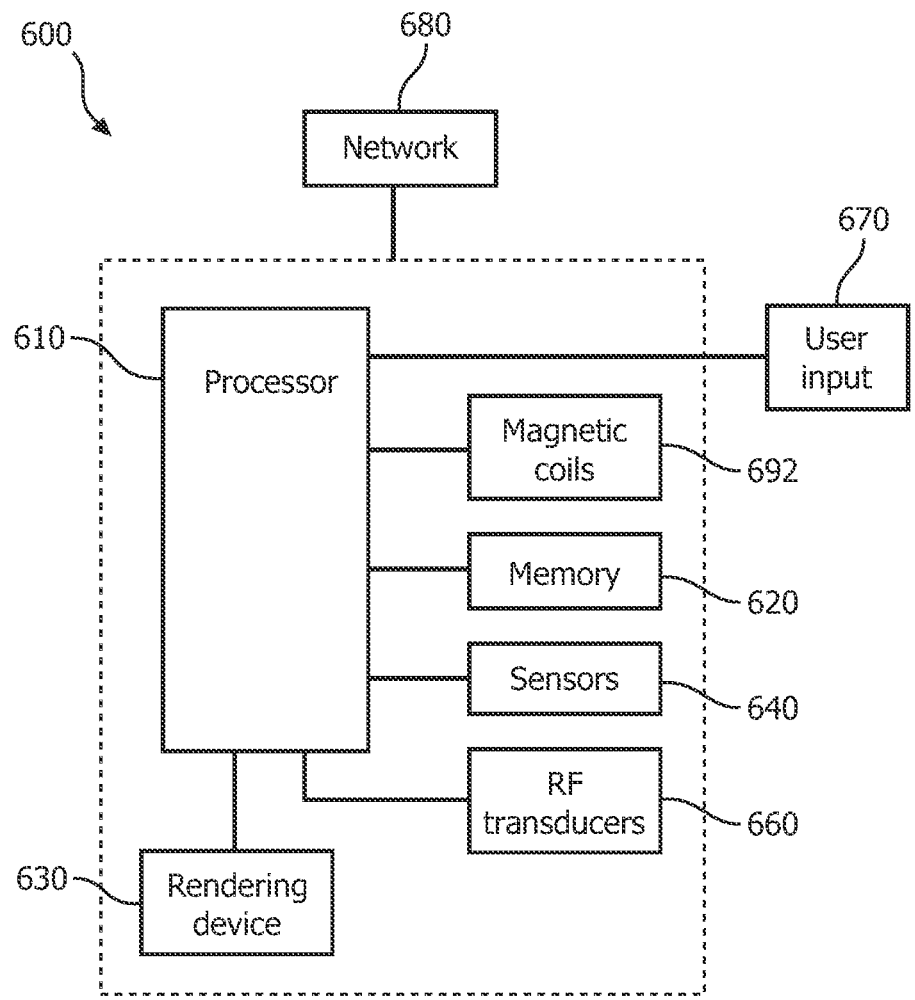
FIG. 6 shows a portion of a system 600 in accordance with embodiments of the present system.

FIG. 6 shows a portion of a system 600 in accordance with embodiments of the present system. For example, a portion of the present system may include a processor 610 (e.g., a controller) operationally coupled to a memory 620, a rendering device such as a display 630, sensors 640, RF portion 660, magnetic coils 692, and a user input device 670. The memory 620 may be any type of device for storing application data as well as other data related to the described operation. The application data and other data are received by the processor 610 for configuring (e.g., programming) the processor 610 to perform operation acts in accordance with the present system. The processor 610 so configured becomes a special purpose machine particularly suited for performing in accordance with embodiments of the present system.

The operation acts may include configuring an MRI system by, for example, controlling optional support actuators, the magnetic coils 692, and/or the RF portion 660. The support actuators may control a physical location (e.g., in x, y, and z axes) of a patient, if desired. The RF portion 660 may be controlled by the processor 610 to control RF transducers such as RF transmission coils and RF reception coils, and RF states (modes) such as tune/detune and synchronization states. The magnetic coils 692 may include main magnetic coils, gradient coils (e.g., x-, y-, and z-gradient coils), and may be controlled to emit a main magnetic field and/or gradient fields in a desired direction and/or strength. The controller may control one or more power supplies to provide power to the magnetic coils 692 so that a desired magnetic field is emitted at a desired time. The RF portion 660 may be controlled to transmit RF pulses at the patient using during a detune state and/or to receive echo information therefrom during a tune state. A reconstructor may process received signals such as the (MR) echo information and transform them (e.g., using one or more reconstruction techniques of embodiments of the present system) into content which may include image information (e.g., still or video images (e.g., video information)), data, and/or graphs that can be rendered on, for example, a user interface (UI) of the present system such as on the display 630, a speaker, etc. Further, the content may then be stored in a memory of the system such as the memory 620 for later use. Thus, operation acts may include requesting, providing, and/or rendering of content such as, for example, reconstructed image information obtained from the echo information. The processor 610 may render the content such as video information on a UI of the system such as a display of the system. A synchronization portion may synchronize a clock of the RF portion 660 with a system clock.

The user input device 670 may be operable for interacting with the processor 610 including enabling interaction within a UI as described herein. Clearly the processor 610, the memory 620, display 630, and/or user input device 670 may all or partly be a portion of a computer system or other device.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 620 or other memory coupled to the processor 610.

The program and/or program portions contained in the memory 620 may configure the processor 610 to implement the methods, operational acts, and functions disclosed herein. The memories may be distributed, for example between the clients and/or servers, or local, and the processor 610, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 610. With this definition, information accessible through a network is still within the memory, for instance, because the processor 610 may retrieve the information from the network for operation in accordance with the present system.

The processor 610 is operable for providing control signals and/or performing operations in response to input signals from the user input device 670 as well as in response to other devices of a network and executing instructions stored in the memory 620. The processor 610 may include one or more of a microprocessor, an application-specific or general-use integrated circuit(s), a logic device, etc. Further, the processor 610 may be a dedicated processor for performing in accordance with the present system or may be a general-purpose processor wherein only one of many functions operates for performing in accordance with the present system. The processor 610 may operate utilizing a program portion, multiple program segments, or may be a hardware device utilizing a dedicated or multi-purpose integrated circuit. Embodiments of the present system may provide imaging methods to acquire and reconstruct images using a wirelessly synchronized clock. Suitable applications may include imaging systems such as magnetic resonance imaging (MRI) systems.

In accordance with embodiments of the present system, power generation, RF clock synchronization to a received system clock signal and signal processing may be performed locally within the RF portion. Accordingly, galvanic cables for DC power and RF transmission are not required thereby, reducing interference that may otherwise be caused by these cables.

Accordingly, embodiments of the present system may overcome the disadvantages of prior art systems and/or provide a wireless clock synchronization system for wireless-type RF coils that can reduce or entirely eliminate phase errors in a received wireless synchronization signal.

While the present invention has been shown and described with reference to particular exemplary embodiments, it will be understood by those skilled in the art that present invention is not limited thereto, but that various changes in form and details, including the combination of various features and embodiments, may be made therein without departing from the spirit and scope of the invention. For example, while described with regard to a wireless RF portion of an MRI system, the present system may be suitably applied in other wireless applications wherein a highly stable synchronized clock is desired. Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated; and i) the term "plurality of" an element includes two or more of the claimed element, and does not imply any particular range of number of elements; that is, a plurality of elements may be as few as two elements, and may include an immeasurable number of elements.

The invention claimed is:

1. A synchronization apparatus, comprising:
a main magnet extending longitudinally, the main magnet having a main bore and opposed first and second ends positioned at opposing longitudinal ends of the main magnet, the main magnet configured to generate a substantially homogenous magnetic field within a scanning volume of the main bore;
a system controller configured to generate a clock synchronization signal in accordance with a system clock;
first and second transmission antennas, the first transmission antenna including a first loop coil situated adjacent to the first opposing longitudinal end of the main magnet and the second transmission antenna including a second loop coil situated adjacent to the second opposing longitudinal end of the main magnet, the first and second loop coils each extending circumferentially and coaxially around a longitudinal axis of the main bore, the first and second loop coils being wired or wirelessly connected to synchronously transmit the clock synchronization signal longitudinally into the main bore from the respective opposing first and second longitudinal ends of the main magnet; and
a radio frequency (RF) portion disposed in the main bore and including:
an RF transmission coil configured to transmit RF excitation pulses to excite magnetic resonance (MR),
RF reception coils configured to receive induced MR echoes,
a synchronization signal reception antenna configured to receive the clock synchronization signal transmitted from the opposing first and second ends of the main magnet by the first and second transmission antennas, and
a synchronizer;
the synchronizer being coupled to the synchronization signal reception antenna and configured to synchronize a clock of the RF portion in accordance with the received clock synchronization signal.

2. The synchronization apparatus of claim 1, wherein first and second transmission antennas are configured relative to the main bore such that the transmitted clock synchronization signal forms a standing wave signal pattern within at least a portion of the main bore of the main magnet.

3. The synchronization apparatus of claim 1, wherein the synchronization signal reception antenna is situated between the first and second transmission antennas to only receive the clock synchronization signal transmitted from respective opposite directions by the first and second transmission antennas positioned at the opposing longitudinal ends of the main magnet.

4. The synchronization apparatus of claim 1, wherein the first and second transmission antennas are wirelessly coupled to each other to form a standing wave resonator having a resonation volume in which the transmitted clock synchronization signal forms a standing wave signal pattern.

5. The synchronization apparatus of claim 4, wherein the synchronization signal reception antenna is situated within a resonation volume between the first and second transmission antennas to only receive the clock synchronization signal transmitted from respective opposite directions by the first and second transmission antennas positioned at the opposing longitudinal ends of the main magnet so as to be situated within the standing wave signal pattern.

6. The synchronization apparatus of claim 1, wherein the clock synchronization signal includes a pilot signal modulated onto a carrier signal in a form of $V_p(t) \cdot \sin(\omega_c \cdot t)$ wherein $V_p$ is an amplitude of the pilot signal as a function of time (t), and $\omega_c$ is an angular frequency of the carrier signal.

7. A method of wirelessly synchronizing a radio frequency (RF) portion of a magnetic resonance (MR) system to a system clock of the MR system, the MR system having at least one controller, a main magnet extending longitudinally and having opposed first and second ends positioned at opposing longitudinal ends of the main magnet, and a main bore situated between the opposed first and second ends, the method being performed by the least one controller, and comprising acts of:
   generating a clock synchronization signal in accordance with the system clock;
   transmitting the clock synchronization signal into the main bore of the main magnet from a first transmission antenna that extends circumferentially around a longitudinal axis of the main bore and is situated adjacent to the first longitudinal end of the main magnet and a second transmission antenna that extends circumferentially around the longitudinal axis of the main bore and is situated adjacent to the second longitudinal end of the main magnet, wherein transmitting the clock synchronization signal includes synchronously transmitting the clock synchronization signal into the main bore from the opposed first and second ends of the main magnet using the first and second transmission antennas, respectively, forming a standing wave pattern within the main bore;
   receiving the clock synchronization signal that is transmitted from the first and second transmission antennas positioned at the opposing longitudinal ends of the main magnet using at least one wireless reception antenna of the RF portion situated within the main bore of the main magnet; and
   synchronizing an internal clock of the RF portion in accordance with the received clock synchronization signal.

8. The method of claim 7, wherein the clock synchronization signal includes a pilot signal modulated onto a carrier signal in a form of $V_p(t) \cdot \sin(\omega_c \cdot t)$ wherein $V_p$ is an amplitude of the pilot signal as a function of time (t), and $\omega_c$ is an angular frequency of the carrier signal.

9. The method of claim 7, further including positioning the at least one reception antenna between the first and second transmission antennas to only receive the clock synchronization signal transmitted from respective opposite directions, wherein the act of receiving the clock synchronization signal further comprises an act of receiving the standing wave pattern of the transmitted clock synchronization signal.

10. The method of claim 7, further comprising an act of wirelessly coupling the first and second antennas together such that the first and second antennas form a standing wave resonator to generate the standing wave signal pattern within the main bore of the main magnet when transmitting the clock synchronization signal.

11. The method of claim 10, wherein the first and second antennas are loop antennas that extend in parallel circumferentially around the longitudinal axis of the main bore to form a Helmholtz coil generating a uniform magnetic field between the first and second signals.

12. A non-transitory computer readable memory medium carrying a computer program configured to wirelessly synchronize a radio frequency (RF) portion of a magnetic resonance (MR) system to a system clock of the MR system, the MR system having at least one controller, and a main magnet extending longitudinally and having opposed first and second ends positioned at opposing longitudinal ends of the main magnet and a main bore situated between the opposed first and second ends, the computer program comprising:
   a program portion configured to:
      generate a clock synchronization signal in accordance with the system clock;
      transmit the clock synchronization signal into the main bore of the main magnet from a first loop transmission antenna that extends circumferentially around a longitudinal axis of the main bore adjacent to the first longitudinal end of the main magnet and from a second loop transmission antenna that extends circumferentially around the longitudinal axis of the main bore adjacent to the second longitudinal end of the main magnet;
      receive the clock synchronization signal from the first and second transmission antennas positioned at the opposing longitudinal ends of the main magnet using at least one wireless reception antenna situated within the main bore of the main magnet; and
      synchronize an internal clock of the RF portion in accordance with the received clock synchronization signal.

13. The non-transitory computer-readable medium of claim 12, wherein the program portion is further configured to synchronously transmit the clock synchronization signal into the main bore from the opposed first and second ends of the main magnet using the first and second transmission antennas, respectively, with the clock synchronization signal comprising a pilot signal modulated onto a carrier signal in a form of $V_p(t) \cdot \sin(\omega_c \cdot t)$ wherein $V_p$ is an amplitude of the pilot signal as a function of time (t), and $\omega_c$ is an angular frequency of the carrier signal, when transmitting the clock synchronization signal.

14. The non-transitory computer-readable medium of claim 12, wherein the at least one reception antenna is positioned between the first and second transmission antennas to only receive the clock synchronization signal transmitted from respective opposite directions and the computer program is further configured to synchronize transmission of the clock synchronization signal by the first and second transmission antennas to form a standing wave pattern within the main bore of the main magnet.

15. The non-transitory computer-readable medium of claim 12, wherein the at least one reception antenna is positioned between the first and second transmission antennas to only receive the clock synchronization signal transmitted from respective opposite directions and the computer program is further configured to provide the clock synchronization signal to each of the first and second transmission antennas with equal amplitude and phase so as to form a standing wave pattern within the main bore when transmitting the clock synchronization signal.

16. The non-transitory computer-readable medium of claim 12, wherein the computer program is further configured to couple the first and second antennas together to form a standing wave resonator to generate a standing wave signal pattern within the main bore of the main magnet when transmitting the clock synchronization signal.

17. A synchronization apparatus, comprising:
a main magnet extending longitudinally, the main magnet having a main bore and opposed first and second ends positioned at opposing longitudinal ends of the main magnet, the main magnet configured to generate a substantially homogenous magnetic field within a scanning volume of the main bore;
a system controller configured to generate a clock synchronization signal in accordance with a system clock;
first and second transmission antennas, the first transmission antenna situated adjacent to the first opposing longitudinal end of the main magnet and the second transmission antenna situated adjacent to the second opposing longitudinal end of the main magnet, the first and second transmission antennas each defining a loop extending circumferentially around a longitudinal axis of the main bore and configured to transmit the clock synchronization signal into the main bore of the main magnet; and
a radio frequency (RF) portion comprising at least one wireless reception antenna and a synchronizer,
the at least one reception antenna being situated within the main bore of the main magnet and configured to receive the clock synchronization signal only from the first and second transmission antennas, and
the synchronizer coupled to the at least reception antenna and configured to synchronize a clock of the RF portion in accordance with the received clock synchronization signal,
wherein first and second transmission antennas are configured relative to the main bore such that the transmitted clock synchronization signal forms a standing wave signal pattern within at least a portion of the main bore of the main magnet.

18. A synchronization apparatus, comprising:
a main magnet extending longitudinally, the main magnet having a main bore and opposed first and second ends positioned at opposing longitudinal ends of the main magnet, the main magnet configured to generate a substantially homogenous magnetic field within a scanning volume of the main bore;
a system controller configured to generate a clock synchronization signal in accordance with a system clock;
first and second transmission antennas, the first transmission antenna situated adjacent to the first opposing longitudinal end of the main magnet and the second transmission antenna situated adjacent to the second opposing longitudinal end of the main magnet, the first and second transmission antennas each extending circumferentially around a longitudinal axis of the main bore and are configured to transmit the clock synchronization signal longitudinally into and longitudinally along the main bore of the main magnet; and
a radio frequency (RF) portion comprising at least one wireless reception antenna and a synchronizer,
the at least one reception antenna situated within the main bore of the main magnet and configured to receive the clock synchronization signal transmitted by the first and second transmission antennas, and
the synchronizer coupled to the at least reception antenna and configured to synchronize a clock of the RF portion in accordance with the received clock synchronization signal,
wherein the first and second antennas are coupled to each other to form a standing wave resonator having a resonation volume in which the transmitted clock synchronization signal forms a standing wave signal pattern.

19. The synchronization apparatus of claim 18, wherein the at least one reception antenna is situated within a resonation volume between the first and second transmission antennas to only receive the clock synchronization signal transmitted from respective opposite directions by the first and second transmission antennas positioned at the opposing longitudinal ends of the main magnet so as to be situated within the standing wave signal pattern.

* * * * *